(12) United States Patent
Ko et al.

(10) Patent No.: US 8,895,664 B2
(45) Date of Patent: Nov. 25, 2014

(54) CURABLE COMPOSITION

(71) Applicant: LG Chem, Ltd., Seoul (KR)

(72) Inventors: Min Jin Ko, Daejeon (KR); Myung Sun Moon, Daejeon (KR); Jae Ho Jung, Daejeon (KR); Bum Gyu Choi, Daejeon (KR); Dae Ho Kang, Daejeon (KR); Min Kyoun Kim, Daejeon (KR); Byung Kyu Cho, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/092,334

(22) Filed: Nov. 27, 2013

(65) Prior Publication Data

US 2014/0088251 A1 Mar. 27, 2014

Related U.S. Application Data

(63) Continuation of application No. PCT/KR2012/010065, filed on Nov. 26, 2012.

(30) Foreign Application Priority Data

Nov. 25, 2011 (KR) .................. 10-2011-0124650
Nov. 26, 2012 (KR) .................. 10-2012-0134558

(51) Int. Cl.

| | | |
|---|---|---|
| *H01L 23/29* | (2006.01) | |
| *C08K 9/06* | (2006.01) | |
| *C08L 83/04* | (2006.01) | |
| *H01L 33/56* | (2010.01) | |
| *C08K 3/22* | (2006.01) | |
| *G02F 1/1339* | (2006.01) | |
| *C08K 3/36* | (2006.01) | |
| *C08K 5/00* | (2006.01) | |
| *C08G 77/12* | (2006.01) | |
| *C08G 77/20* | (2006.01) | |
| *C08K 5/56* | (2006.01) | |

(52) U.S. Cl.
CPC ............. *H01L 23/296* (2013.01); *C08K 9/06* (2013.01); *C08L 83/04* (2013.01); *C08K 3/22* (2013.01); *G02F 1/1339* (2013.01); *C08K 3/36* (2013.01); *C08K 5/0025* (2013.01); *C08G 77/12* (2013.01); *C08G 77/20* (2013.01); *C08K 5/56* (2013.01); *H01L 33/56* (2013.01)
USPC ...... 525/100; 524/862; 257/100; 257/E33.059

(58) Field of Classification Search
CPC ....................................................... C08L 83/04
USPC ............................................................. 524/862
See application file for complete search history.

(56) References Cited

U.S. PATENT DOCUMENTS

| | | | | |
|---|---|---|---|---|
| 7,314,770 | B2 * | 1/2008 | Boardman et al. | 438/30 |
| 7,595,113 | B2 * | 9/2009 | Miyoshi | 428/447 |
| 7,615,387 | B2 * | 11/2009 | Miyoshi | 438/22 |
| 7,635,508 | B2 * | 12/2009 | Aketa et al. | 428/35.6 |
| 2002/0037963 | A1 * | 3/2002 | Hara et al. | 525/100 |
| 2002/0129898 | A1 * | 9/2002 | Takuman et al. | 156/329 |
| 2010/0301377 | A1 * | 12/2010 | Kato et al. | 257/100 |
| 2011/0018235 | A1 * | 1/2011 | Dumont et al. | 280/728.1 |
| 2013/0014823 | A1 | 1/2013 | Ko | |

FOREIGN PATENT DOCUMENTS

| | | |
|---|---|---|
| JP | 2009120437 A | 6/2009 |
| JP | 2010248384 A | 11/2010 |
| KR | 1020110087244 A | 8/2011 |
| KR | 101074505 B1 | 10/2011 |

* cited by examiner

*Primary Examiner* — Robert S Loewe
(74) *Attorney, Agent, or Firm* — McKenna Long & Aldridge, LLP

(57) ABSTRACT

Provided is a curable composition and its use. The curable composition may exhibit excellent processability and workability. The curable composition has excellent light extraction efficiency, crack resistance, hardness, thermal and shock resistance and an adhesive property after curing. The curable composition may provide a cured product exhibiting stable durability and reliability under severe conditions in a long time, and not inducing whitening and surface stickiness.

17 Claims, No Drawings

CURABLE COMPOSITION

This application is a Continuation Bypass Application of International Patent Application No. PCT/KR2012/010065, filed Nov. 26, 2012, which claims priority to and the benefit of Korean Patent Application Nos. 10-2011-0124650 filed on Nov. 25, 2011 and 10-2012-0134558, filed on Nov. 26, 2012, in the Korean Intellectual Property Office, all of which are hereby incorporated by reference.

FIELD

The present application relates to a curable composition and its use.

BACKGROUND

A light emitting diode (LED) is a blue or ultraviolet (UV) LED particularly having an emission wavelength of approximately 250 to 550 nm, which is a high-brightness product using a GaN-based compound semiconductor such as GaN, GaAlN, InGaN or InAlGaN. In addition, it is being possible to form a high-quality full-color image by a method of combining red and green LEDs with a blue LED. For example, a technique of manufacturing a white LED in combination of a blue or UV LED with a phosphor has been known. Such an LED is being widely used for a back light for a liquid crystal display (LCD) or general lights.

As an LED encapsulant, an epoxy resin having a high adhesive property and excellent mechanical durability is being widely used. However, the epoxy resin has a lower light transmittance of a blue light or UV ray region, and low light resistance. Accordingly, for example, in the patent documents 1 to 3, techniques for solving the above-described problems. However, encapsulants disclosed in the above references do not have sufficient thermal resistance and light resistance.

As a material having excellent light and thermal resistances with respect to a low wavelength region, a silicon resin has been known. However, the silicon resin has stickiness on a cured surface. In addition, to effectively apply the silicon resin as an encapsulant for an LED, characteristics such as high refractivity, a crack resistance, a surface hardness, an adhesive strength and a thermal and shock resistance are necessarily ensured.

PRIOR ART DOCUMENTS

<Patent document 1> Japanese Patent Publication No. H11-274571
<Patent document 1> Japanese Patent Publication No. 2001-196151
<Patent document 1> Japanese Patent Publication No. 2002-226551

DETAILED DESCRIPTION

Technical Object

The present application relates to a curable composition and its use.

Technical Solution

Illustrative curable composition may include (A) an organopolysiloxane including an alkenyl group and an aryl group, (B) an organopolysiloxane including an aryl group and a hydrogen atom binding to a silicon atom and (C) an inorganic particle, the surface of which is treated with an organopolysiloxane including an aryl group.

In one embodiment, the (A) organopolysiloxane may be represented as an average composition formula of Formula 1.

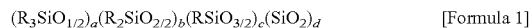

$$(R_3SiO_{1/2})_a(R_2SiO_{2/2})_b(RSiO_{3/2})_c(SiO_2)_d \qquad \text{[Formula 1]}$$

In Formula 1, R's are substituents binding to silicon atoms, and are each independently an alkoxy group, a hydroxyl group, an epoxy group, a (meth)acryloyl group, an isocyanate group or a monovalent hydrocarbon group, with the proviso that at least one of R's is an alkenyl group and at least one of R's is an aryl group; and a is 0 or a positive number, b is a positive number, c is a positive number and d is 0 or a positive number.

The (A) organopolysiloxane is an organopolysiloxane including a monofunctional siloxane unit (hereinafter, referred to as an ⌜M unit⌟) which may be represented as $(R_3SiO_{1/2})$, a 2-functional siloxane unit (hereinafter, referred to as a ⌜D unit⌟) which may be represented as $(R_2SiO_{2/2})$, a 3-functional siloxane unit (hereinafter, referred to as an ⌜T unit⌟) which may be represented as $(RSiO_{3/2})$ and/or a 4-functional siloxane unit (hereinafter, referred to as a ⌜Q unit⌟) which may be conventionally represented as $(SiO_2)$, and has the average composition formula of Formula 1.

The sentence "an organopolysiloxane is represented as a conventional average composition formula" used herein includes that the organopolysiloxane is a mono component represented as the predetermined average composition formula, or a mixture or reaction product of at least two components, and an average of compositions of respective components in the mixture or reaction product is represented as the predetermined average composition formula.

The term "monovalent hydrocarbon group" used herein may refer to a monovalent residue derived from an organic compound composed of carbon and hydrogen or a derivative thereof. The monovalent hydrocarbon group includes one or at least two carbons, and in another example, may be a monovalent hydrocarbon group having 1 to 25 or 2 to 25 carbon atoms. As a monovalent hydrocarbon group, an alkyl group, an alkenyl group or an aryl group may be used.

The term "alkyl group" used herein may refer to, unless specifically defined otherwise, an alkyl group having 1 to 20, 1 to 16, 1 to 12, 1 to 8 or 1 to 4 carbon atoms. The alkyl group may have a linear, branched or cyclic structure, and may be optionally substituted with at least one substituent.

In addition, the term "alkenyl group" may refer to, unless specifically defined otherwise, an alkenyl group having 2 to 20, 2 to 16, 2 to 12, 2 to 8 or 2 to 4 carbon atoms. The alkenyl group may have a linear, branched or cyclic structure, and may be optionally substituted with at least one substituent.

Moreover, the term "aryl group" used herein may refer to, unless specifically defined otherwise, a monovalent residue having a benzene ring or derived from a compound including a structure in which at least two benzene rings are connected or condensed or a derivative thereof. That is, in the range of the aryl group, an aralkyl group or arylalkyl group, as well as an aryl group conventionally referred to as an aryl group may be used. The aryl group may be an aryl group having 6 to 25, 6 to 21, 6 to 18 or 6 to 13 carbon atoms. The aryl group may be a phenyl group, a dichlorophenyl group, a chlorophenyl group, a phenylethyl group, a phenylpropyl group, a benzyl group, a tollyl group, a xylyl group or a naphthyl group, and preferably, in one embodiment, is a phenyl group.

The term "alkoxy group" used herein may refer to, unless specifically defined otherwise, an alkoxy group having 1 to 20, 1 to 16, 1 to 12, 1 to 8 or 1 to 4 carbon atoms. The alkoxy group has a linear, branched or cyclic structure, and may be optionally substituted with at least one substituent.

The term "epoxy group" used herein may refer to, unless specifically defined otherwise, a monovalent residue derived from a cyclic ether having three ring-forming atoms or a compound including the cyclic ether. The epoxy group may be a glycidyl group, an epoxyalkyl group, a glycidoxyalkyl group or an alicyclic epoxy group. An alkyl group in the epoxy group may be a linear, branched or cyclic alkyl group having 1 to 20, 1 to 16, 1 to 12, 1 to 8 or 1 to 4 carbon atoms. In addition, the alicyclic epoxy group may refer to a monovalent residue having an aliphatic hydrocarbon ring structure, and derived from a compound including a structure in which two carbon atoms forming the aliphatic hydrocarbon ring also form an epoxy group. The alicyclic epoxy group may be an alicyclic epoxy group having 6 to 12 carbon atoms, for example, a 3,4-epoxycyclohexylethyl group.

In the specification, as a substitutent capable of being optionally substituted to an alkoxy group, an epoxy group, a monovalent hydrocarbon group, an alkyl group, an alkenyl group or an aryl group, halogen, an epoxy group, an acryloyl group, a methacryloyl group, an isocyanate group, a thiol group or the above-described monovalent hydrocarbon group, but the present application is not limited thereto.

In the average composition formula of Formula 1, a, b, c and d may each refer to a molar ratio having a siloxane unit, and the sum of a+b+c+d may be 1, a may be 0 to 0.5, b may be 0 to 0.8 or more than 0 to 0.8, c may be 0 to 0.8 or more than 0 to 0.8, and d may be 0 to 0.2.

In one embodiment, the (A) organopolysiloxane includes at least one aryl group binding to a silicon atom. In the illustrative (A) organopolysiloxane, a molar ratio (Ar/Si) of the aryl group binding to the silicon atom with respect to a total of silicon atoms (Si) in the organopolysiloxane may be 0.3, 0.35 or 0.4 or more. In this range, the organopolysiloxane or an encapsulant including the same may maintain excellent characteristics such as a refractive index, light extraction efficiency, crack resistance, hardness and viscosity. Meanwhile, the upper limit of the molar ratio (Ar/Si) may be, for example, 0.7, 0.8 or 1.1.

the (A) organopolysiloxane includes at least one alkenyl group binding to a silicon atom. In the illustrative (A) organopolysiloxane, a molar ratio (Ak/Si) of the alkenyl group binding to the silicon atom with respect to a total of silicon atoms (Si) in the organopolysiloxane may be 0.05, 0.1 or 0.15 or more. In this range, the organopolysiloxane or an encapsulant including the same may maintain excellent characteristics such as a refractive index, light extraction efficiency, crack resistance, hardness and viscosity. Meanwhile, the upper limit of the molar ratio (Ak/Si) may be, for example, 0.3 or 0.35.

The (A) organopolysiloxane may have a viscosity at 25° C. of 2,000, 3,000, 4,000, 5,000, 7,000, 9,000 or 9,500 cP or more. In this range, processibiltiy and hardness of the organopolysiloxane may be suitably maintained. The upper limit of the viscosity is not particularly limited, and for example, the viscosity may be 100,000, 90,000, 80,000, 70,000 or 65,000 cP or less.

The (A) organopolysiloxane may have a weight average molecular weight (Mw) of 1,500, 2,000, 3,000, 4,000 or 5,000 or more. The term "weight average molecular weight" used herein refers to a conversion value with respect to a standard polystyrene measured by gel permeation chromatography (GPC). In addition, unless specifically defined otherwise in the specification, the term "molecular weight" may refer to a weight average molecular weight. In this range, moldability, hardness and strength of the polysiloxane may be suitably maintained. Meanwhile, the upper limit of the molecular weight is not particularly limited, and may be 14,000, 12,000 or 10,000 or less.

The (A) organopolysiloxane may include, for example, a linear or partially-crosslinkable organopolysiloxane and a crosslinkable organopolysiloxane.

The linear organopolysiloxane may be, for example, an organopolysiloxane represented by Formula 2.

$$R^1_3SiO(R^1_2SiO)_aSiR^1_3 \quad \text{[Formula 2]}$$

In Formula 2, $R^1$'s are each independently a monovalent hydrocarbon group, at least one of $R^1$ is an alkenyl group, with the proviso that at least one of $R^1$'s is an aryl group; and a is a number of 1 to 500. In Formula 2, the "a" may be, for example, approximately 5 to 300 or 10 to 200.

In Formula 2, at least one of $R^1$ may be an alkenyl group, which may be present in the range capable of satisfying the above-described molar ratio (Ak/Si) of the (A) organopolysiloxane. In addition, the (A) organopolysiloxane of Formula 2 may include at least one aryl group binding to a silicon atom, which may be also present in the range capable of satisfying the above-described molar ratio (Ar/Si) of the (A) organopolysiloxane.

The linear organopolysiloxane may be a reaction product of a mixture including a cyclic siloxane compound, for example, a ring-opening polymerization product. The cyclic siloxane compound may be a compound represented by Formula 3.

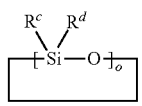

[Formula 3]

In Formula 3, $R^c$ and $R^d$ are each independently a monovalent hydrocarbon group and o is 3 to 6. In Formula 3, specific kinds of $R^c$ and $R^d$ and the range of o may be determined by an organopolysiloxane having a desired structure.

The mixture may be a cyclic siloxane compound, which may include a compound of Formula 4 and/or a compound of Formula 5.

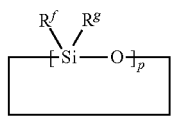

[Formula 4]

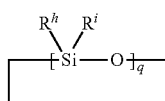

[Formula 5]

In Formulas 4 and 5, $R^f$ and $R^g$ are each independently an alkyl group having 1 to 20 carbon atoms, $R^h$ and $R^i$ are each independently an aryl group having 6 to 25 carbon atoms, p is a number of 3 to 10, and q is a number of 3 to 10.

In Formulas 4 and/or 5, specific kinds of $R^f$ and $R^g$ and the ranges of p and q may be determined by an organopolysiloxane having a desired structure.

When the cyclic siloxane compound is used, an organopolysiloxane having a desired structure may be synthesized at a sufficient molecular weight. When the above mixture is reacted, functional groups such as an alkoxy group or hydroxyl group binding to a silicon atom in the synthesized organopolysiloxane may be minimized, thereby preparing a desired product having excellent physical properties.

In one embodiment, the mixture may further include a compound represented by Formula 6.

$(R_3Si)_2O$ [Formula 6]

In Formula 6, R's are each independently a monovalent hydrocarbon. In Formula 6, specific kinds of the R's and a mixing ratio in the mixture may be determined by a structure of a desired organopolysiloxane.

In one embodiment, the reaction of respective components in the mixture may be performed in the presence of a suitably catalyst. Therefore, the mixture may further include a catalyst. As a catalyst capable of being included in the mixture, for example, a base catalyst may be used. A suitable base catalyst may be, but is not limited to, a metal hydroxide such as KOH, NaOH or CsOH; a metal silanolate including an alkali metal compound and a siloxane, or a quaternary ammonium compound such as tetramethylammonium hydroxide, tetraethylammonium hydroxide or tetrapropylammonium hydroxide.

A ratio of the catalyst in the mixture may be suitably selected in consideration of desired reactivity, and for example, may be 0.01 to 30 parts by weight or 0.03 to 5 parts by weight with respect to 100 parts by weight of a total weight of the reaction products in the mixture. In the specification, unless specifically defined otherwise, a unit "parts by weight" refers to a weight ratio between components.

In one embodiment, the reaction may be performed in the presence of a suitable solvent. As a solvent, the reaction product in the mixture, that is, disiloxane or organopolysiloxane may be suitably mixed with a catalyst, and any kind of a solvent may be used without obstruction to reactivity. The solvent may be, but is not limited to, a aliphatic hydrocarbon-based solvent such as n-pentane, i-pentane, n-hexane, i-hexane, 2,2,4-trimethyl pentane, cyclohexane or methylcyclohexane; an aromatic solvent such as benzene, toluene, xylene, trimethyl benzene, ethyl benzene or methylethyl benzene, a ketone-based solvent such as methylethylketone, methylisobutylketone, diethylketone, methyl n-propyl ketone, methyl n-butyl ketone, cyclohexanone, methylcyclohexanone or acetylacetone; an ether-based solvent such as tetrahydrofuran, 2-methyl tetrahydrofuran, ethyl ether, n-propyl ether, isopropyl ether, diglyme, dioxine, dimethyldioxine, ethyleneglycol mono methyl ether, ethyleneglycol dimethyl ether, ethyleneglycol diethyl ether, propyleneglycol monomethyl ether or propyleneglycol dimethyl ether; an ester-based solvent such as diethyl carbonate, methyl acetate, ethyl acetate, ethyl lactate, ethyleneglycol mono methyl ether acetate, propyleneglycol mono methyl ether acetate or ethyleneglycol diacetate; or an amide-based solvent such as N-methylpyrollidone, foramide, N-methyl formamide, N-ethyl formamide, N,N-dimethyl acetamide or N,N-diethylacetamide.

The reaction may be performed by adding the catalyst to the reaction product. Here, a reaction temperature may be controlled within a range of, for example, 0 to 150° C. or 30 to 130° C. In addition, a reaction time may be controlled within a range of, for example, 1 hour to 3 days.

The reaction product prepared through the reaction described above may include a low molecular weight component, for example, a low molecular weight component including a compound of Formula 7 along with the linear organopolysiloxane.

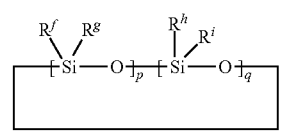
[Formula 7]

In Formula 7, $R^f$ and $R^g$ are each independently an alkyl group having 1 to 20 carbon atoms, $R^h$ and $R^i$ are each independently an aryl group having 6 to 25 carbon atoms, p is a number of 0 to 10 or 3 to 10, and q is a number of 3 to 10.

The compound of Formula 7 is a kind of a low molecular weight component included in the reaction product. The term "low molecular weight component" used herein may refer to a component included in the reaction product, that is, a component having a molecular weight of 800 or less.

The reaction product including a linear organopolysiloxane may include a low molecular weight component, for example, a low molecular weight component including the compound of Formula 7 at 10, 8 or 6 weight % or less. The reaction product having desired physical properties may be prepared through the above operations. For example, a ratio of the low molecular weight component may be controlled through a conventional refining method known in the related art.

The term "organopolysiloxane having a partially-crosslinked structure" used herein may refer to a structure of an organopolysiloxane which is a sufficiently long linear structure derived from D unit, to which T or Q unit is partially introduced thereto. For example, partially-crosslinked structure may refer to a structure in which a ratio (D/(D+T)) of a total of D units with respect to a total of D and T units included in the organopolysiloxane is 0.7 or more. The ratio (D/(D+T)) may be, for example, less than 1.

As an organopolysiloxane having a partially-crosslinked structure, an organopolysiloxane having an average empirical structure of Formula 8 may be used.

$(R^1R^2_2SiO_{1/2})_a(R^3R^4SiO_{2/2})_b(R^5SiO_{3/2})_c(SiO_2)_d$ [Formula 8]

In Formula 8, $R^1$ is a monovalent hydrocarbon group having 2 or more carbon atoms, $R^2$ is an alkyl group having 1 to 4 carbon atoms, $R^3$ and $R^4$ are each independently an alkyl group having 1 to 20 carbon atoms, an alkenyl group having 2 to 20 carbon atoms or an aryl group having 6 to 25 carbon atoms, $R^5$ is an alkyl group having 1 to 20 carbon atoms or an aryl group having 6 to 25 carbon atoms, with the proviso that at least one of $R^1$, $R^3$ and $R^4$ is an alkenyl group; and a is a positive number, b is 0 or a positive number, c is a positive number, d is 0 or a positive number, b/a is 5 or more, and b/c is 5 or more. Here, the definition of the monovalent hydrocarbon group described above is applied identically to the monovalent hydrocarbon group having 2 or more carbon atoms, but only the lower limit of the number of carbon atoms is limited to 2.

In Formula 8, at least one of $R^1$, $R^3$ and $R^4$ is an alkenyl group, which may be controlled in a range satisfying the molar ratio (Ak/Si) of an alkenyl group (Ak) of the (A) organopolysiloxane described above. In addition, an organopolysiloxane having the average composition formula of Formula 8 may include an aryl group binding to a silicon atom, and may be present to satisfy the molar ratio (Ar/Si) of an aryl group of the (A) organopolysiloxane described above.

In Formula 8, a to d may each refer to a molar ratio of a siloxane unit, and when the sum of (a+b+c+d) is converted into 1, a may be 0.01 to 0.10 or 0.01 to 0.2, b may be 0 to 0.98 or 0 to 2.0, c may be 0.01 to 0.30, and d may be 0 to 0.3.

The organopolysiloxane of Formula 8 may have a structure having a structure derived from T unit (hereinafter, referred to as a "crosslinked structure") and a sufficiently-long linear structure derived from D unit. The illustrative organopolysiloxane may have b/c of 5, 7, 8 or 10 or more in the average composition formula of Formula 8. In addition, in the average composition formula, b/a may be 5, 8 or 10 or more. Here, the upper limit of b/c may be, but is not particularly limited to, for example, 70, 60, 50, 40, 30 or 25. In addition, the upper limit of b/a may be, but is not particularly limited to, for example, 110, 100, 90, 80, 70, 60, 50 or 40. In Formula 8, b/(a+b+c+d) may be, for example, 0.5, 0.6 or 0.7 or more. The upper limit of b/(a+b+c+d) may be, but is not particularly limited to, less than 1 or 0.98 or less. In Formula 8, for example, b/(b+c) may be 0.5, 0.6 or 0.7 or more. The upper limit of b/(b+c) may be, but is not particularly limited to, less than 1 or 0.98 or less. In the above ratio of the siloxane unit, suitable physical properties may be exhibited according to an application.

In one embodiment, the organopolysiloxane of Formula 8 may be a compound represented as an average composition formula of Formula 9.

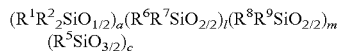   [Formula 9]

In Formula 9, $R^1$, $R^2$ and $R^5$ are the same as defined in Formula 8, $R^6$ is an aryl group having 6 to 25 carbon atoms, $R^7$, $R^8$ and $R^9$ are each independently an alkyl group having 1 to 20 carbon atoms, an alkenyl group having 2 to 20 carbon atoms or an aryl group having 6 to 25 carbon atoms, with the proviso that at least one of $R^1$, $R^7$, $R^8$ and $R^9$ is an alkenyl group; and when a+l+m+c is converted into 1, a is 0.01 to 0.10, l is 0 to 0.90, m is 0 to 0.90, and c is 0.01 to 0.30. However, l and m are not simultaneously 0, (l+m)/a is 5 or more, and (l+m)/c is 5 or more.

In the average composition formula of Formula 9, a, l, m and c each refer to a molar ratio of a siloxane unit. Here, when the sum of (a+l+m+c) is converted into 1, a is 0.01 to 0.10, l is 0 to 0.90, m is 0 to 0.90, and c is 0.01 to 0.30. In addition, here, the sum of l and m is represented as b in the empirical formula of Formula 8, a, l, m and c may be controlled to satisfy the molar ratios described in the category of Formula 8. For example, in the average composition formula of Formula 9, l and m are not simultaneously 0. In addition, for example, in Formula 9, (l+m)/c may be 5, 7, 8 or 10 or more. In addition, in the average composition formula, (l+m)/a may be 5, 8 or 10 or more. Here, the upper limit of (l+m)/c may be, but is not particularly limited to, for example, 70, 60, 50, 40, 30 or 25. In addition, the upper limit of (l+m)/a may also be, but is not particularly limited to, for example, 110, 100, 90, 80, 70, 60, 50 or 40. In Formula 9, (l+m)/(a+l+m+c) may be, for example, 0.5, 0.6 or 0.7 or more. The upper limit of (l+m)/(a+l+m+c) may be, but is not particularly limited to, less than 1 or 0.98 or less. In Formula 9, (l+m)/(l+m+c) may be, for example, 0.5, 0.6 or 0.7 or more. The upper limit of (l+m)/(l+m+c) may be, but is not particularly limited to, less than 1 or 0.98 or less.

In addition, in the average composition formula of Formula 9, either l or m may not be 0. When neither l nor m is 0, l/m may be within a range of 0.4 to 2.0, 0.4 to 1.5 or 0.5 to 1.

In one embodiment, the organopolysiloxane having the average composition formula of Formula 8 or 9 may include a unit of Formula 10 or 11.

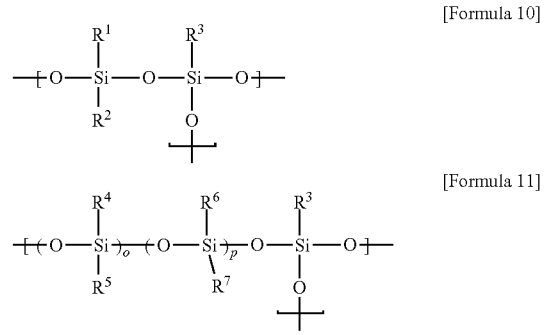

In Formulas 10 and 11, $R^1$ to $R^8$ are each independently an alkyl group having 1 to 20 carbon atoms, an alkenyl group having 2 to 20 carbon atoms or an aryl group having 6 to 25 carbon atoms, o is 0 to 300, and p is 0 to 300.

The illustrative organopolysiloxane may include at least one unit of Formula 10 or 11. The unit of Formula 10 or 11 is a unit in which a silicon atom of D unit and a silicon atom of T unit in a siloxane unit forming the organopolysiloxane are directly bound to each other via an oxygen atom. In one embodiment, as described above, even when the organopolysiloxane is a mixture of at least two components and an average of compositions of respective components is represented as the average composition formula of Formula 8 or 9, the organopolysiloxane may include at least one of a single component having the unit of Formula 10 or 11. The organopolysiloxane including the unit of Formula 10 or 11 will be prepared, for example, by a reaction of a cyclic siloxane compound with an organopolysiloxane having a cage or partial cage structure or T unit, as to be described below. Particularly, when the above method is applied, an organopolysiloxane including the unit of Formula 10 or 11, and the minimized number of silicon atoms bound with alkoxy and hydroxyl groups in its structure is possibly prepared.

The organopolysiloxane having a partially-crosslinked structure may be prepared, for example, by further mixing an organopolysiloxane including a cage structure or partial cage structure or T unit in a mixture for preparing the linear organopolysiloxane, that is, a mixture including the cyclic siloxane compound for a reaction. Here, the organopolysiloxane including a cage structure or partial cage structure or T unit may be represented as an average composition formula of Formula 12 or 13.

[$R^eSiO_{3/2}$]   [Formula 12]

[$R^aR^b{}_2SiO_{1/2}$]$_p$[$R^eSiO_{3/2}$]$_q$   [Formula 13]

In Formula 12 or 13, $R^a$ is a monovalent hydrocarbon group having 2 or more carbon atoms, $R^b$ is an alkyl group having 1 to 4 carbon atoms, $R^e$ is each independently an aryl group having 6 to 25 carbon atoms, an alkyl group having 1 to 20 carbon atoms or a monovalent hydrocarbon group having 2 or more carbon atoms, o is 3 to 6, p is 1 to 3, and q is 1 to 10.

In Formula 12 or 13, a specific kind of $R^a$, specific values of p and q, and a ratio of respective components in the mixture may be determined by an organopolysiloxane having a desired structure.

When a mixture including a cyclic siloxane compound forming a linear organopolysiloxane along with the organopolysiloxane having the average composition formula (s) of Formula (s) 12 and/or 13 is(are) reacted, an organopolysiloxane having a desired structure, for example, the above-described partially-crosslinked structure may be synthesized at a sufficient molecular weight.

In the process of preparing a partially-crosslinkable organopolysiloxane, a method of performing the reaction is not particularly limited, and may progress based on the process of preparing the linear organopolysiloxane. In addition, a reaction product including the partially-crosslinkable organopolysiloxane may also include in the above-described ratio of the low molecular weight component.

The (A) organopolysiloxane may include an organopolysiloxane having a crosslinked structure along with the linear or partially-crosslinkable organopolysiloxane.

The term "organopolysiloxane having a crosslinked structure" used herein may refer to an organopolysiloxane having a structure not corresponding to the partially-crosslinked structure among organopolysiloxanes including at least one of T or Q unit in its structure.

In one embodiment, the organopolysiloxane having a crosslinked structure may be represented as an average composition formula of Formula 14.

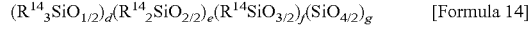  [Formula 14]

In Formula 14, $R^{14}$'s are each independently an epoxy group having a monovalent hydrocarbon group. In the above, at least one of $R^{14}$ is an alkenyl group, at least one of $R^{14}$ is an aryl group, and when d+e+f+g is converted into 1, d is 0.05 to 0.5, e is 0 to 0.3, f is 0.6 to 0.95, and g is 0 to 0.2. Here, f and g are not simultaneously 0, (d+e)/(d+e+f+g) is 0.2 to 0.7, e/(e+f+g) is 0.3 or less, and f/(f+g) is 0.8 or more.

In Formula 14, one or at least two of $R^{14}$ may be an alkenyl group, or one or at least two of $R^{14}$ may be an aryl group. The alkenyl and aryl groups may be selected to satisfy the molar ratio (Ak/Si) of the alkenyl group and the molar ratio (Ar/Si) of the aryl group to the (A) organopolysiloxane described above.

In Formula 14, d, e, f and g is each a molar ratio of a siloxane unit, and when the sum thereof is converted into 1, d is 0.05 to 0.5, e is 0 to 0.3, f is 0.6 to 0.95, and g is 0 to 0.2. However, f and g are not simultaneously 0. To maximize the strength, crack resistance and thermal and shock resistance of a cured product, here, (d+e)/(d+e+f+g) may be controlled to 0.2 to 0.7, e/(e+f+g) may be controlled to 0.3 or less, and f/(f+g) may be controlled to 0.8 or more. Here, the lower limit of e/(e+f+g) is not particularly limited, and for example, e/(e+f+g) may exceed 0. In addition, here, the upper limit of f/(f+g) may be, but is not particularly limited to, 1.0.

The organopolysiloxane having a crosslinked structure may employ, for example, a preparing method conventionally known in the related art, or a similar method to that for preparing the (A) organopolysiloxane.

The (A) organopolysiloxane may include the organopolysiloxane having a crosslinked structure at 50 to 1,000 parts by weight or 50 to 700 parts by weight with respect to 100 parts by weight of the linear or partially-crosslinkable organopolysiloxane. In this range, the strength, crack resistance and thermal and shock resistance of the cured product may be excellently maintained. In the specification, unless specifically defined otherwise, the unit "parts by weight" refers to a weight ratio.

A curable composition may include (B) an organopolysiloxane including one or at least two of hydrogen atoms binding to a silicon atom.

(B) organopolysiloxane may serve as a crosslinking agent for crosslinking the (A) organopolysiloxane. For example, crosslinking may be performed by an addition-reaction of a hydrogen atom of (B) organopolysiloxane with an alkenyl group of the (A) organopolysiloxane.

As (B) compound, various kinds of compounds including a hydrogen atom binding to a silicon atom (Si—H) may be used. (B) compound may be a linear, branched, cyclic or crosslinkable organopolysiloxane. (B) compound may be a compound having 2 to 1000 or 3 to 300 silicon atoms in one molecule.

In one embodiment, (B) compound may be a compound of Formula 15 or a compound represented as an average composition formula of Formula 16.

  [Formula 15]

In Formula 15, $R^{15}$'s are each independently hydrogen or a monovalent hydrocarbon group, with the proviso that one or at least two of $R^{15}$ are hydrogen atoms, and at least one of $R^{15}$ is an aryl group; and n is 1 to 100.

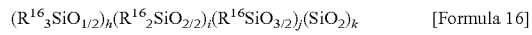  [Formula 16]

In Formula 16, $R^{16}$'s are each independently hydrogen or a monovalent hydrocarbon group, with the proviso that one or at least two of $R^{16}$ are hydrogen atoms and at least one of $R^{16}$ is an aryl group. When h+i+j+k is converted into 1, h is 0.1 to 0.8, i is 0 to 0.5, j is 0.1 to 0.8, k is 0 to 0.2, but i and k are not simultaneously 0.

The compound of Formula 15 may be a linear organopolysiloxane having at least two hydrogen atoms binding to a silicon atom, and in Formula 15, n may be 1 to 100, 1 to 50, 1 to 25, 1 to 10 or 1 to 5.

Meanwhile, the compound represented as the average composition formula of Formula 16 may be an organopolysiloxane having a crosslinked structure.

A molar ratio (H/Si) of a hydrogen atom (H) binding to a silicon atom with respect to a total of silicon atoms (Si) included in (B) compound may be 0.2 to 0.8 or 0.3 to 0.75. As the molar ratio may be controlled to 0.2 or 0.3 or more, the curability of the composition may be excellently maintained, and as the molar ratio may be controlled to 0.8 or 0.75 or less, the crack resistance and thermal and shock resistance may be excellently maintained.

In addition, (B) compound may include at least one of an aryl group, and therefore, at least one of $R^{15}$ in Formula 15 or at least one of $R^{16}$ in Formula 16 may be an aryl group, for example, an aryl group having 6 to 25, 6 to 21, 6 to 18 or 6 to 12 carbon atoms, or a phenyl group. Accordingly, a refractive index and a hardness of the cured product may be effectively controlled. The aryl group may be present at such an amount that a molar ratio (Ar/Si) of the aryl group (Ar) with respect to a total of silicon atoms (Si) included in (B) compound is 0.3 to 1.2 or 0.3 to 1.0. As the molar ratio (Ar/Si) is controlled to 0.3 or more, the refractive index and hardness of the cured product may be maximized, or as the molar ratio (Ar/Si) is controlled to 1.2, 1.1 or 1.0 or less, a viscosity and a crack resistance of the composition may be suitably maintained.

The (B) compound may have a viscosity at 25° C. of 0.1 to 100,000 cP, 0.1 to 10,000 cP, 0.1 to 1,000 cP or 0.1 to 300 cP. When (B) compound has such a viscosity, a processability of the composition and the hardness of the cured product may be excellently maintained.

The (B) compound may have a molecular weight of, for example, less than 2,000, 1,000 or 800. When the molecular weight of (B) compound is 1,000 or more, a strength of the cured product may be degraded. The lower limit of the molecular weight of the (B) compound may be, but is not particularly limited to, for example, 250. In the (B) compound, the molecular weight may refer to a weight average molecular weight, or a conventional molecular weight of the compound.

A method of preparing (B) compound may employ, but not limited to, for example, a conventionally known method in the related art for preparing an organopolysiloxane, or the same method for preparing the (A) organopolysiloxane.

In one embodiment, a content of the (B) compound may be determined according to an amount of an alkenyl group having a different component included in a curable composition such as the (A) organopolysiloxane. In one embodiment, the (B) compound may be selected to have a molar ratio (H/Ak) of a hydrogen atom (H) binding to a silicon atom included in the (B) compound with respect to a total of alkenyl groups (Ak) included in the curable composition of 0.5 to 2.0 or 0.7 to 1.5. A composition may be provided by blending the compounds in the above molar ratio (H/Ak) to exhibit excellent processability and workability before curing, and by being cured to exhibit excellent crack resistance, hardness, thermal and shock resistance and adhesive property and not to induce whitening under severe conditions, or surface stickiness. The content of the (B) compound may be, for example, 50 to 500 parts by weight or 50 to 400 parts by weight with respect to 100 parts by weight of the (A) compound.

The curable composition may include an inorganic particle whose surface is treated with the organopolysiloxane (hereinafter, an organopolysiloxane for surface treatment) which has an average composition formula of Formula 17 and, of which a molar ratio (Ar/Si) of an aryl group (Ar) binding to a silicon atom with respect to a total of silicon atoms (Si) of 0.1 to 1.8.

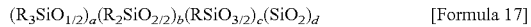

$$(R_3SiO_{1/2})_a(R_2SiO_{2/2})_b(RSiO_{3/2})_c(SiO_2)_d \quad \text{[Formula 17]}$$

In Formula 17, R's are each independently hydrogen, a hydroxyl group, an alkoxy group, an epoxy group, a (meth)acryloyl group, an isocyanate group or a monovalent hydrocarbon group, with the proviso that at least one of R's is an aryl group; and a, b, c and d are each independently 0 or a positive number. In the above, the sum (a+b+c+d) of the a, b, c and d is 1.

In the average composition formula of Formula 17, a, b, c and d may each be a molar ratio of a siloxane unit, the sum of (a+b+c+d) may be 1, a may be 0 to 0.3, b may be 0 to 1, c may be 0 to 0.8, and d may be 0 to 0.8.

The organopolysiloxane for surface treatment includes at least one aryl group binding to a silicon atom, for example, an aryl group having 6 to 25, 6 to 21, 6 to 18 or 6 to 12 carbon atoms or a phenyl group. In the illustrative organopolysiloxane, a molar ratio (Ar/Si) of the aryl group (Ar) binding to a silicon atom with respect to a total of silicon atoms (Si) included in the organopolysiloxane may be 0.1 to 1.8 or 0.3 to 1.0. When the ratio is excessively low or high, compatibility with components of a different curable composition and a decrease in difference in refractive index may be degraded.

The organopolysiloxane for surface treatment may include at least one functional group such as a hydroxyl group or alkoxy group, and preferably, hydroxyl group to perform suitable surface treatment. A molar ratio (P/Si) of the functional group (P) with respect to a total of silicon atoms (Si) included in the organopolysiloxane may be 0.1, 0.3 or 0.5 or more. In such a range, it may be possible to perform sufficient surface treatment using the organopolysiloxane.

The organopolysiloxane for surface treatment may be included at 1 to 1000 parts by weight, 1 to 900 parts by weight, 1 to 800 parts by weight, 1 to 700 parts by weight, 1 to 600 parts by weight, 1 to 500 parts by weight, 1 to 400 parts by weight, 1 to 300 parts by weight, 1 to 200 parts by weight, 1 to 100 parts by weight or 0.2 to 30 parts by weight relative to 100 parts by weight of the inorganic filler whose surface is treated.

The inorganic filler whose surface is treated with the organopolysiloxane may be, but is not particularly limited to, one or at least two of silica, alumina, zinc oxide, zirconium oxide, aluminosilicate, titanium oxide, cesium oxide, hafnium oxide, niobium pentoxide, tantalum pentoxide, indium oxide, tin oxide, indium tin oxide, silicon, zinc sulfide, calcium carbonate, barium sulfate and magnesium oxide. Here, in consideration of the refractive index, silica, alumina or an aluminosilicate particle may be used, but the present application is not limited thereto.

The inorganic filler may have an average diameter of approximately 1 to 100 nm or 1 to 50 nm. In such a diameter range, the inorganic filler may be uniformly dispersed in the resin, thereby suitably ensuring desired effects.

A method of treating a surface of the inorganic filler with the organopolysiloxane for surface treatment is not particularly limited, and may use a method of stirring the organopolysiloxane and the inorganic filler in a solvent to react. In this method, a reaction temperature may be controlled within a range, for example, approximately 10 to 100° C.

The surface-treated filler may be included at approximately 0.1 to 30 or 0.2 to 10 parts by weight relative to 100 parts by weight of the total weight of the (A) and (B) organopolysiloxanes. In such a range, processability may be maintained and an addition effect may be ensured.

The composition may further include a hydroxylation catalyst. The hydroxylation catalyst may be any of the conventional components known in the related art. Such a catalyst may be a platinum-, palladium- or rhodium-based catalyst. In the specification, a platinum-based catalyst may be used in consideration of catalyst efficiency, and may be, but is not limited to, chloroplatinic acid, platinum tetrachloride, an olefin complex of platinum, an alkenyl siloxane complex of platinum or a carbonyl complex of platinum.

A content of the hydroxylation catalyst is not particularly limited as long as the hydroxylation catalyst is included at a catalytic amount, that is, an amount capable of serving as a catalyst. Conventionally, the hydroxylation catalyst may be used at 0.1 to 500 ppm or 0.2 to 100 ppm based on an atomic weight of platinum, palladium or rhodium.

The composition may further include a tackifier in an aspect of additional enhancement of an adhesive property to various kinds of bases. A tackifier is a component capable of improving a self adhesive property to the composition or cured product, which may particularly improve a self adhesive property to a metal and an organic resin.

The tackifier may be, but is not limited to, a silane having at least one or two functional groups selected from the group consisting of an alkenyl group such as a vinyl group, a (meth)acryloyloxy group, a hydroxylyl group (SiH group), an epoxy group, an alkoxy group, an alkoxysilyl group, a carbonyl group and a phenyl group; or an organic organopolysiloxane such as a cyclic or linear siloxane having 2 to 30 or 4 to 20 silicon atoms. One or at least two of the tackifiers may be additionally mixed.

The tackifier may be included in the composition at a content of 0.1 to 20 parts by weight with respect to 100 parts by weight of a total content of the (A) and (B) organopolysiloxanes. The content may be suitably changed in consideration of desired improvement in adhesive property.

The composition may further include one or at least two of additives including a reaction inhibitor such as 2-methyl-3-butyne-2-ol, 2-phenyl-3-1-butyne-2-ol, 3-methyl-3-pentene-1-in, 3,5-dimethyl-3-hexene-1-in, 1,3,5,7-tetramethyl-1,3,5, 7-tetrahexenylcyclotetrasiloxane or ethynylcyclohexane; an inorganic filler such as silica, alumina, zirconia or titania; a carbon-functional silane having an epoxy group and/or alkoxysilyl group, a partial hydrolysis-condensation product thereof or an organopolysiloxane; a thixotropic agent such as a haze-phase silica capable of being used in combination with polyether; a conductivity providing agent such as metal powder of silver, copper or aluminum or various carbon materials; or a color adjusting agent such as a pigment or dye, when necessary.

In one embodiment, the curable composition may further include a phosphor. In this case, a kind of a phosphor which can be used is not particularly limited, and for example, a conventional kind of a phosphor applied to an LED package may be used to realize white light.

Another aspect of the present application provides a semiconductor device. The illustrative semiconductor device may be encapsulated by an encapsulant including a cured product of the curable composition.

As a semiconductor device encapsulated by an encapsulant, a diode, transistor, a thyristor, photocoupler, CCD, solid-phase image pick-up diode, monolithic IC, hybrid IC, LSI, VLSI or LED.

In one embodiment, the semiconductor device may be a light emitting diode.

The light emitting diode may be one formed by stacking a semiconductor material on a substrate. The semiconductor material may be, but is not limited to, GaAs, GaP, GaAlAs, GaAsP, AlGaInP, GaN, InN, AlN, InGaAlN or SiC. In addition, as the substrate, a sapphire, spinel, SiC, Si, ZnO or GaN monocrystal may be used.

In addition, to prepare the light emitting diode, when necessary, a buffer layer may be formed between a substrate and a semiconductor material. As a buffer layer, GaN or AlN may be used. A method of stacking a semiconductor material on a substrate may be, but is not particularly limited to, MOCVD, HDVPE or liquid growth. In addition, a structure of the light emitting diode may be, for example, monojunction including MIS junction, PN junction, and PIN junction, heterojunction, or double heterojunction. In addition, the light emitting diode may be formed using a mono or multiple quantum well structure.

In one embodiment, an emission wavelength of the light emitting diode may be, for example, 250 to 550 nm, 300 to 500 nm or 330 to 470 nm. The emission wavelength may refer to a main emission peak wavelength. As the emission wavelength of the light emitting diode is set in the above range, a white light emitting diode having a longer life span, high energy efficiency and high color expression may be obtained.

The light emitting diode may be encapsulated using the composition. In addition, the encapsulation of the light emitting diode may be performed only using the composition, and in some cases, another encapsulant may be used in combination with the composition. When two kinds of encapsulants are used in combination, after the encapsulation using the composition, the encapsulated light emitting diode may be also encapsulated with another encapsulant, or the light emitting diode is encapsulated with another encapsulant and then encapsulated again with the composition. As another encapsulant, an epoxy resin, a silicon resin, an acryl resin, a urea resin, an imide resin or glass may be used.

To encapsulate the light emitting diode with the composition, for example, a method including previously injecting the composition into a mold-type mould, dipping a read frame to which the light emitting diode is fixed therein and curing the composition, or a method including injecting the composition into a mould into which the light emitting diode is inserted and curing the composition. As a method of injecting the composition, injection by a dispenser, transfer molding or injection molding may be used. In addition, as other encapsulating methods, a method of dropping the composition on the light emitting diode, coating the composition by screen printing or using a mask, and curing the composition, and a method of injecting the composition into a cup in which the light emitting diode is disposed on its bottom by a dispenser and curing the composition may be included.

In addition, the composition may be used as a diamond material fixing the light emitting diode to a read terminal or package, or a passivation layer or package substrate on the light emitting diode when necessary.

When it is necessary to cure the composition, the curing is not particularly limited, and may be performed, for example, by maintaining the composition at a temperature of 60 to 200° C. for 10 minutes to 5 hours, or in phases with at least two steps at a suitable temperature and for a suitable time.

A shape of the encapsulant is not particularly limited, and for example, may be a bullet-type lens, plane, or thin film shape.

In addition, additional enhancement of performance of the light emitting diode may be promoted according to the conventional method known in the related art. To enhance the performance, for example, a method of disposing a reflective layer or light collecting layer on a back surface of the light emitting diode, a method of forming a complementary coloring part on its bottom, a method of disposing a layer absorbing light having a shorter wavelength than the main emission peak on the light emitting diode, a method of encapsulating the light emitting diode and further molding the light emitting diode with a lightweight material, a method of inserting the light emitting diode into a through hole to fix, or a method of contacting the light emitting diode with a read member by flip-chip contact to extract light from a direction of the substrate may be used.

The light emitting diode may be effectively applied to, for example, backlights for a liquid crystal display (LCD), lights, various kinds of sensors, light sources of a printer and a copy machine, light sources for a mobile gauge, signal lights, pilot lights, display devices, light sources of planar-type light emitting devices, displays, decorations or various kinds of lights.

Effect

Illustrative curable composition exhibits excellent processability and workability. In addition, the curable composition exhibits excellent light extraction efficiency, crack resistance, hardness, thermal and shock resistance and an adhesive property after curing. In addition, the composition may provide an encapsulant exhibiting stable durability and reliability under severe conditions in a long time, and not inducing whitening and surface stickiness.

DETAILED DESCRIPTION OF ILLUSTRATIVE EMBODIMENTS

Hereinafter, the present application will be described in further detail with reference to Examples according to the present application and Comparative Examples not according to the present application, but the scope of the present application is not limited to the following Examples.

Hereinafter, the abbreviation "Vi" refers to a vinyl group, the abbreviation "Ph" refers to a phenyl group, the abbreviation "Me" refers to a methyl group, and the abbreviation "Ep" refers to 3-glycidoxypropyl.

1. Measurement of Light Transmittance

A 1 mm-thick specimen was prepared by injecting a curable composition between two layers of glass substrates spaced 1 mm apart from each other, maintaining the composition at 60° C. for 30 minutes, and curing the composition while maintaining again at 150° C. for 1 hour. Afterward, light transmission was measured in a thickness direction at a wavelength of 450 mm using a UV-VIS spectrometer.

2. Evaluation of Brightness of Device

A brightness of a device was evaluated using a 6030 LED package formed of polyphthalamide (PPA). In detail, a surface-mounted LED was prepared by dispensing the curable composition in a polyphthalamide cup and maintaining the composition at 60° C. for 30 minutes, and curing the composition while maintained again at 150° C. for 1 hour. Afterward, the brightness was measured while a 20 mA current was applied.

Example 1

Surface Treatment of Inorganic Filler 20 g of aqueous dispersion of silica (solid content: 40 weight %, average diameter of silica: 10 nm) was diluted with 70 g of ethanol, and then was mixed with a surface treatment solution prepared by dissolving 15 g of a methylphenyl oligomer (an aryl group molar ratio (Ar/Si): 0.4), both ends of which were hydroxyl groups in 50 g of isopropyl alcohol, and maintaining the resulting mixture at room temperature for 3 days. Afterward, a non-reacted material was washed, distilled under a decreased pressure, and thereby a surface-treated inorganic filler was obtained.

Preparation of Curable Composition

A curable composition was prepared by mixing compounds prepared by a known method and represented as Formulas A to D, thereby being cured by a hydroxylation reaction (Mixing Amount: Compound of Formula A: 80 g, Compound of Formula B: 20 g, Compound of Formula C: 200 g, Compound of Formula D: 70 g). Subsequently, a catalyst (Platinum(0)-1,3-divinyl-1,1,3,3-tetramethyldisiloxane) was added to the composition so as for a content of Pt(0) to be 5 ppm and uniformly mixed, and bubbles were removed with a defoamer. Afterward, the curable composition was prepared by adding 5 g of the previously prepared surface-treated inorganic filler to the resulting composition.

$(ViMe_2SiO_{1/2})_2(ViMeSiO_{2/2})_2(PhMeSiO_{2/2})_{40}$ [Formula A]

$(ViMe_2SiO_{1/2})_2(EPSiO_{3/2})_3(MePhSiO_{2/2})_{20}$ [Formula B]

$(ViMe_2SiO_{1/2})_2(Ph_2SiO_{2/2})_{0.5}(PhSiO_{3/2})_6$ [Formula C]

$(HMe_2SiO_{1/2})_2(Ph_2SiO_{2/2})_{1.5}$ [Formula D]

Example 2

20 g of a silica aqueous dispersion (solid content: 40 weight %, average diameter of silica: 10 nm) was diluted with 70 g of ethanol, and then was mixed with a surface treatment solution prepared by dissolving 15 g of a methylphenyl oligomer (an aryl group molar ratio (Ar/Si): 0.9), both ends of which were hydroxyl groups in 50 g of isopropyl alcohol, and maintaining the resulting mixture at room temperature for 3 days. Afterward, a non-reacted material was washed, distilled under a decreased pressure, and thereby a surface-treated inorganic filler was obtained. A curable composition was prepared as described in Example 1, except that the inorganic filler was used.

Comparative Example 1

A curable composition was prepared as described in Example 1, except that an inorganic filler which was not subjected to surface treatment was used.

Comparative Example 2

20 g of a silica aqueous dispersion (solid content: 40 weight %, average diameter of silica: 10 nm) was diluted with 70 g of ethanol, a surface treatment solution prepared by dissolving 15 g of a diphenyl oligomer (an aryl group molar ratio (Ar/Si): 2.0) both ends of which were hydroxyl groups in 50 g of isopropyl alcohol, and maintaining the resulting solution at room temperature for 3 days. Afterward, a non-reacted material was washed, distilled under a decreased pressure, and thereby a surface-treated inorganic filler was obtained. A curable composition was prepared as described in Example 1, except that the inorganic filler was used.

Comparative Example 3

A curable composition was prepared by mixing compounds prepared by a known method and represented as Formulas E to H, thereby being cured by a hydroxylation reaction (Mixing Amount: Compound of Formula E: 100 g, Compound of Formula F: 20 g, Compound of Formula G: 100 g, Compound of Formula 14: 25 g). Subsequently, the curable composition was completed by adding 5 g of the inorganic filler the same as used in Example 1 to the resulting composition.

$(ViMe_2SiO_{1/2})_2(PhMeSiO_{2/2})_5(Me_2SiO_{2/2})_{50}$ [Formula E]

$(ViMe_2SiO_{1/2})_2(EPSiO_{3/2})_3(Me_2SiO_{2/2})_{20}$ [Formula F]

$(ViMe_2SiO_{1/2})_2(Me_2SiO_{2/2})_{0.5}(MeSiO_{3/2})_6(PhSiO_{3/2})$ [Formula G]

$(HMe_2SiO_{1/2})_2(HMeSiO_{2/2})_{10}$ [Formula H]

Comparative Example 4

A curable composition was prepared by mixing compounds prepared by a known method and represented as Formulas I to L, thereby being cured by a hydroxylation reaction (Mixing Amount: Compound of Formula I: 80 g, Compound of Formula J: 10 g, Compound of Formula K: 200 g, Compound of Formula L: 70 g). Subsequently, the curable composition was completed by adding 5 g of the inorganic filler the same as used in Example 1 to the resulting composition.

$(ViMe_2SiO_{1/2})_2(Ph_2SiO_{2/2})_{20}(Me_2SiO_{2/2})_{10}$ [Formula I]

$(ViMe_2SiO_{1/2})_2(EPSiO_{3/2})_3(MePhSiO_{2/2})_{20}$ [Formula J]

$(ViMe_2SiO_{1/2})_2(Ph_2SiO_{2/2})_4(PhSiO_{3/2})_6$ [Formula K]

$(HMe_2SiO_{1/2})_2(Ph_2SiO_{2/2})_{2.5}$ [Formula L]

The measured physical properties of each curable composition were shown in Table 1.

TABLE 1

| | Light Transmittance (Light Transmittance of Film) | Brightness (Luminescence of Device) |
|---|---|---|
| Example 1 | 90% | 86 lm |
| Example 2 | 90% | 86 lm |

TABLE 1-continued

| | Light Transmittance (Light Transmittance of Film) | Brightness (Luminescence of Device) |
|---|---|---|
| Comparative Example 1 | 75% | 81 lm |
| Comparative Example 2 | 79% | 80 lm |
| Comparative Example 3 | 85% | 83 lm |
| Comparative Example 4 | 68% | 79 lm |

What is claimed is:

1. A curable composition, comprising:
(A) an organopolysiloxane, which comprises an organopolysiloxane having an average composition formula of Formula 8, and which comprises an aliphatic unsaturated bond and an aryl group and of which a molar ratio (Ar/Si) of aryl groups (Ar) binding to silicon atoms with respect to a total of silicon atoms (Si) is from 0.3 to 1.1;
(B) an organopolysiloxane, which comprises an aryl group and a hydrogen atom binding to a silicon atom and of which a molar ratio (Ar/Si) of aryl groups (Ar) binding to silicon atoms with respect to a total of silicon atoms (Si) is from 0.3 to 1.2; and
(C) an inorganic particle, of which the surface is treated with an organopolysiloxane which has an average composition formula of Formula 17 and of which a molar ratio (Ar/Si) of aryl groups (Ar) binding to silicon atoms with respect to a total of silicon atoms (Si) is from 0.1 to 1.8:

$$(R^1R^2{}_2SiO_{1/2})_a(R^3R^4SiO_{2/2})_b(R^5SiO_{3/2})_c(SiO_2)_d \quad \text{[Formula 8]}$$

where $R^1$ is a monovalent hydrocarbon group having 2 or more carbon atoms, $R^2$ is an alkyl group having 1 to 4 carbon atoms, $R^3$ and $R^4$ are each independently an alkyl group having 1 to 20 carbon atoms, an alkenyl group having 2 to 20 carbon atoms or an aryl group having 6 to 25 carbon atoms, $R^5$ is an alkyl group having 1 to 20 carbon atoms or an aryl group having 6 to 25 carbon atoms, with the proviso that at least one of $R^1$, $R^3$ and $R^4$ is an alkenyl group; a is a positive number, b is a positive number, c is a positive number, d is 0 or a positive number, b/a is 5 or more, and b/c is 5 or more, $$(R_3SiO_{1/2})_a(R_2SiO_{2/2})_b(RSiO_{3/2})_c(SiO_2)_d \quad \text{[Formula 17]}$$

where R's are independently hydrogen, a hydroxyl group, an alkoxy group, an epoxy group, a (meth)acryloyl group, an isocyanate group or a monovalent hydrocarbon group, with the proviso that at least one of R's is an aryl group; and a, b, c and d are each independently 0 or a positive number, with the proviso that the sum thereof (a+b+c+d) is 1, and a is 0 to 0.3, b is 0 to 1, c is 0 to 0.8, and d is 0 to 0.8.

2. The curable composition according to claim 1, wherein the (A) organopolysiloxane has an average composition formula of Formula 1:

$$(R_3SiO_{1/2})_a(R_2SiO_{2/2})_b(RSiO_{3/2})_c(SiO_2)_d \quad \text{[Formula 1]}$$

where R's are substituents binding to silicon atoms, and are each independently an alkoxy group, a hydroxyl group, an epoxy group, a (meth)acryloyl group, an isocyanate group or a monovalent hydrocarbon group, with the proviso that at least one of R's is an alkenyl group and at least one of R's is an aryl group; a is 0 or a positive number, b is a positive number, c is a positive number, and d is 0 or a positive number.

3. The curable composition according to claim 1, wherein a molar ratio (Ak/Si) of alkenyl groups in the (A) organopolysiloxane with respect to silicon atoms in the (A) organopolysiloxane is from 0.05 to 0.35.

4. The curable composition according to claim 1, wherein the (A) organopolysiloxane comprises an organopolysiloxane having an average composition formula of Formula 2:

$$R^1{}_3SiO(R^1{}_2SiO)_aSiR^1{}_3 \quad \text{[Formula 2]}$$

where $R^1$'s are each independently a monovalent hydrocarbon group, with the proviso that at least one of $R^1$'s is an alkenyl group and at least one of $R^1$'s is an aryl group; and a is a number of 1 to 500.

5. The curable composition according to claim 1, wherein the (A) organopolysiloxane comprises an organopolysiloxane having an average composition formula of Formula 14:

$$(R^{14}{}_3SiO_{1/2})_d(R^{14}{}_2SiO_{2/2})_e(R^{14}SiO_{3/2})_f(SiO_{4/2})_g \quad \text{[Formula 14]}$$

where $R^{14}$'s are each independently a monovalent hydrocarbon group or an epoxy group, with the proviso that at least one of $R^{14}$'s is an alkenyl group and at least one of $R^{14}$'s is an aryl group; and when d+e+f+g is converted into 1, d is 0.05 to 0.5, e is 0 to 0.3, f is 0.6 to 0.95, and g is 0 to 0.2, with the proviso that f and g are not simultaneously 0, (d+e)/(d+e+f+g) is from 0.2 to 0.7, e/(e+f+g) is 0.3 or less, and f/(f+g) is 0.8 or more.

6. The curable composition film according to claim 1, wherein the (B) organopolysiloxane is a compound of Formula 15 or a compound having an average composition formula of Formula 16:

$$R^{15}{}_3SiO(R^{15}{}_2SiO)_nSiR^{15}{}_3 \quad \text{[Formula 15]}$$

where $R^{15}$'s are each independently hydrogen or a monovalent hydrocarbon group, with the proviso that at least one of $R^{15}$'s is hydrogen atoms and at least one of $R^{15}$'s is an aryl group; and n is 1 to 100, $$(R^{16}{}_3SiO_{1/2})_h(R^{16}{}_2SiO_{2/2})_i(R^{16}SiO_{3/2})_j(SiO_2)_k \quad \text{[Formula 16]}$$

Where $R^{16}$'s are each independently hydrogen or a monovalent hydrocarbon group, with the proviso that at least one of $R^{16}$'s is hydrogen atoms and at least one of $R^{16}$'s is an aryl group; and when h+i+j+k is converted into 1, h is 0.1 to 0.8, i is 0 to 0.5, j is 0.1 to 0.8, k is 0 to 0.2, with the proviso that i and k are not simultaneously 0.

7. The curable composition according to claim 1, wherein a molar ratio (H/Si) of hydrogen atoms binding to silicon atoms in the (B) organopolysiloxane with respect to a total of silicon atoms in the (B) organopolysiloxane is from 0.1 to 0.75.

8. The curable composition according to claim 1, wherein the (B) organopolysiloxane is comprised in such an amount that a molar ratio (H/Ak) of a hydrogen atom in the (B) organopolysiloxane with respect to alkenyl groups in the curable composition can be from 0.5 to 2.0.

9. The curable composition according to claim 1, wherein the organopolysiloxane of Formula 17 is comprised in an amount of 1 to 1,000 parts by weight relative to 100 parts by weight of the inorganic particle.

10. The curable composition according to claim 1, wherein the inorganic particle is silica, alumina, zinc oxide, zirconium oxide, aluminosilicate, titanium oxide, cesium oxide, hafnium oxide, niobium pentoxide, tantalum pentoxide, indium oxide, tin oxide, indium tin oxide, silicon, zinc sulfide, calcium carbonate, barium sulfate or magnesium oxide.

11. The curable composition according to claim 1, wherein the inorganic particle has an average diameter of 1 to 100 nm.

12. The curable composition according to claim 1, wherein the inorganic particle is comprised in an amount of 0.1 to 30 parts by weight relative to 100 parts by weight of the sum of (A) and (B) organopolysiloxanes.

13. The curable composition according to claim 1, further comprising a catalyst.

14. A semiconductor device encapsulated with a cured product of the curable composition of claim 1.

15. A light emitting diode encapsulated with a cured product of the curable composition of claim 1.

16. A liquid crystal display comprising the light emitting diode of claim 15.

17. A lighting apparatus comprising the light emitting diode of claim 15.

* * * * *